Feb. 24, 1953

B. PARZEN 2,629,864

RECEIVER TUNING DEVICE

Filed Feb. 6, 1948

2 SHEETS—SHEET 1

INVENTOR.
BENJAMIN PARZEN

BY

R. P. Morris

ATTORNEY

Feb. 24, 1953 B. PARZEN 2,629,864

RECEIVER TUNING DEVICE

Filed Feb. 6, 1948 2 SHEETS—SHEET 2

INVENTOR.
BENJAMIN PARZEN

BY

R P Morris

ATTORNEY

Patented Feb. 24, 1953 2,629,864

UNITED STATES PATENT OFFICE 2,629,864

RECEIVER TUNING DEVICE

Benjamin Parzen, New York, N. Y., assignor to International Standard Electric Corporation, New York, N. Y., a corporation of Delaware Application February 6, 1948, Serial No. 6,700

5 Claims. (Cl. 343—5)

Figure 1:
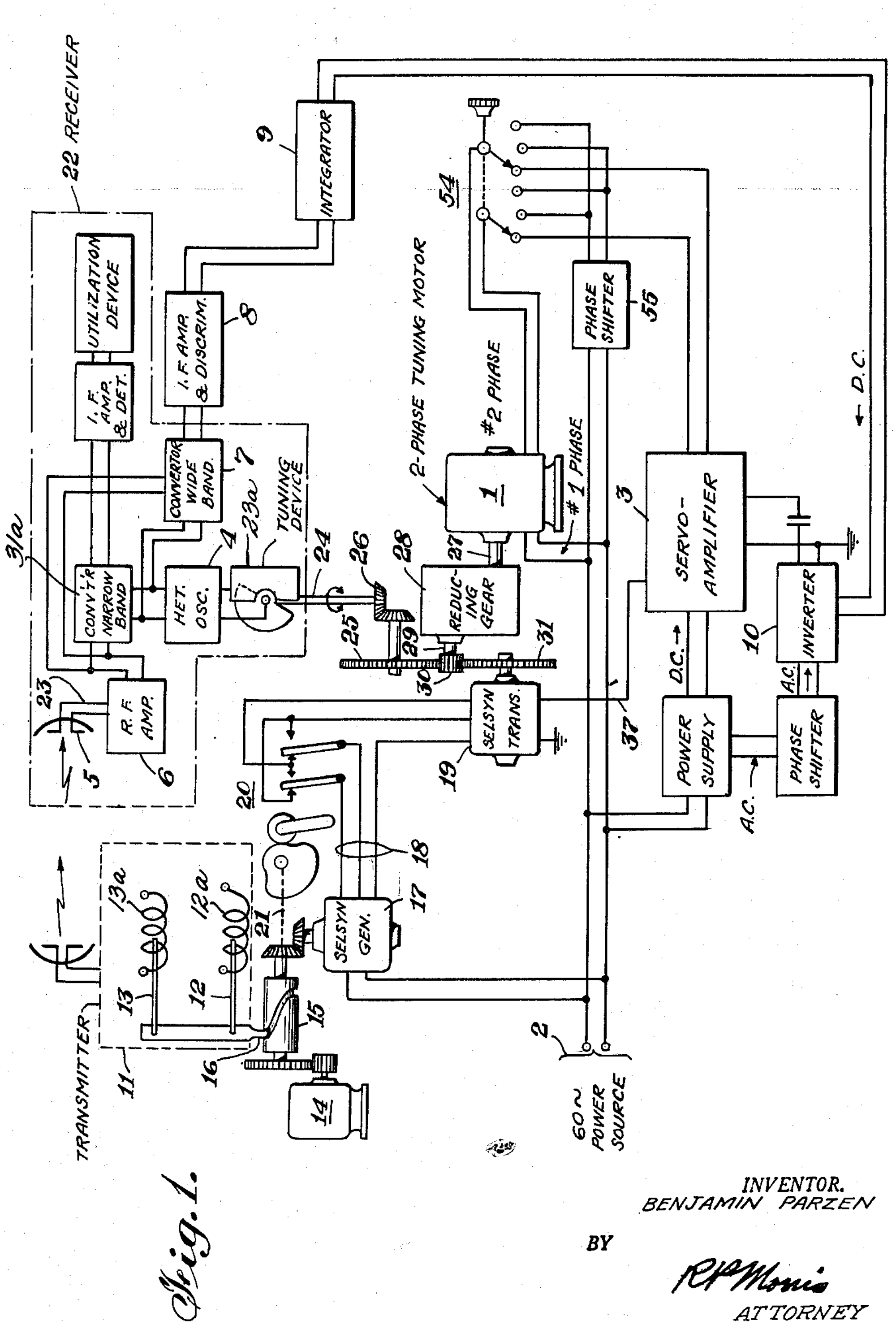

This invention relates to tuning devices for radio receivers, and more particularly to a system which will maintain a receiver in tune with the frequency of an incoming carrier wave despite variations of that wave over a wide band of frequencies.

In the operation of radar equipment it is sometimes the practice to wobble the frequency of the transmitter in order to increase the difficulty with which the signals might be "jammed" by energy action. It is sometimes desirable to produce a frequency deviation in the transmitter of as much as ± ½ megacycle per second. The mean frequency may be set anywhere within a range of 90 megacycles per second.

Automatic frequency control devices have been used in the past which enable a receiver to be maintained in tune with the frequency of an incoming carrier wave. If, however, that frequency is varied beyond certain limits, it was necessary to resort to manual control of the tuning elements. My invention obviates this necessity by the provision of electro-mechanical tuning equipment which is adapted to take over the tuning function whenever the electronic tuning means fails to operate because of departures of the carrier frequency from a predetermined tuning range.

My invention may find utility in applications other than in radar equipment. An explanation of its use in such equipment should, therefore, be considered merely illustrative. It is well known that radio receivers must be tuned accurately to the incoming carried wave and that, even when the frequency of the transmitted wave is maintained constant, the tuning of the receiver has a tendency to drift, due to temperature changes in the circuit components and the tubes, as well as to other causes.

In carrying out my invention I provide certain electronic equipment for maintaining automatic frequency control of the heterodyne oscillator in the receiver. In addition to this I also provide electro-mechanical equipment for readjusting the position of the main tuning shaft in the receiver whenever said electronic equipment loses control.

The principal object of my invention is to provide an automatic frequency control system that may be applied to any tunable receiver having any type of local oscillator.

A further object is to provide an automatic frequency control system which will be effective not merely to adjust the frequency of the local oscillator, but also to tune any other circuits of the receiver which may require tuning under varying conditions of reception. If the tuning of these other circuits is made variable, rather than fixed, it is obvious that they may be designed or much narrower bands of frequency response than would be the case with fixed frequency tuning. A decided advantage is, therefore, gained in the fulfilment of this object.

A still further object of my invention is to provide an automatic frequency control system that is positive in action under all conditions of signal reception, even when the usual electronic frequency control means would fail to produce tracking of the local oscillator with the frequency variations of the incoming carrier wave.

Figure 2:
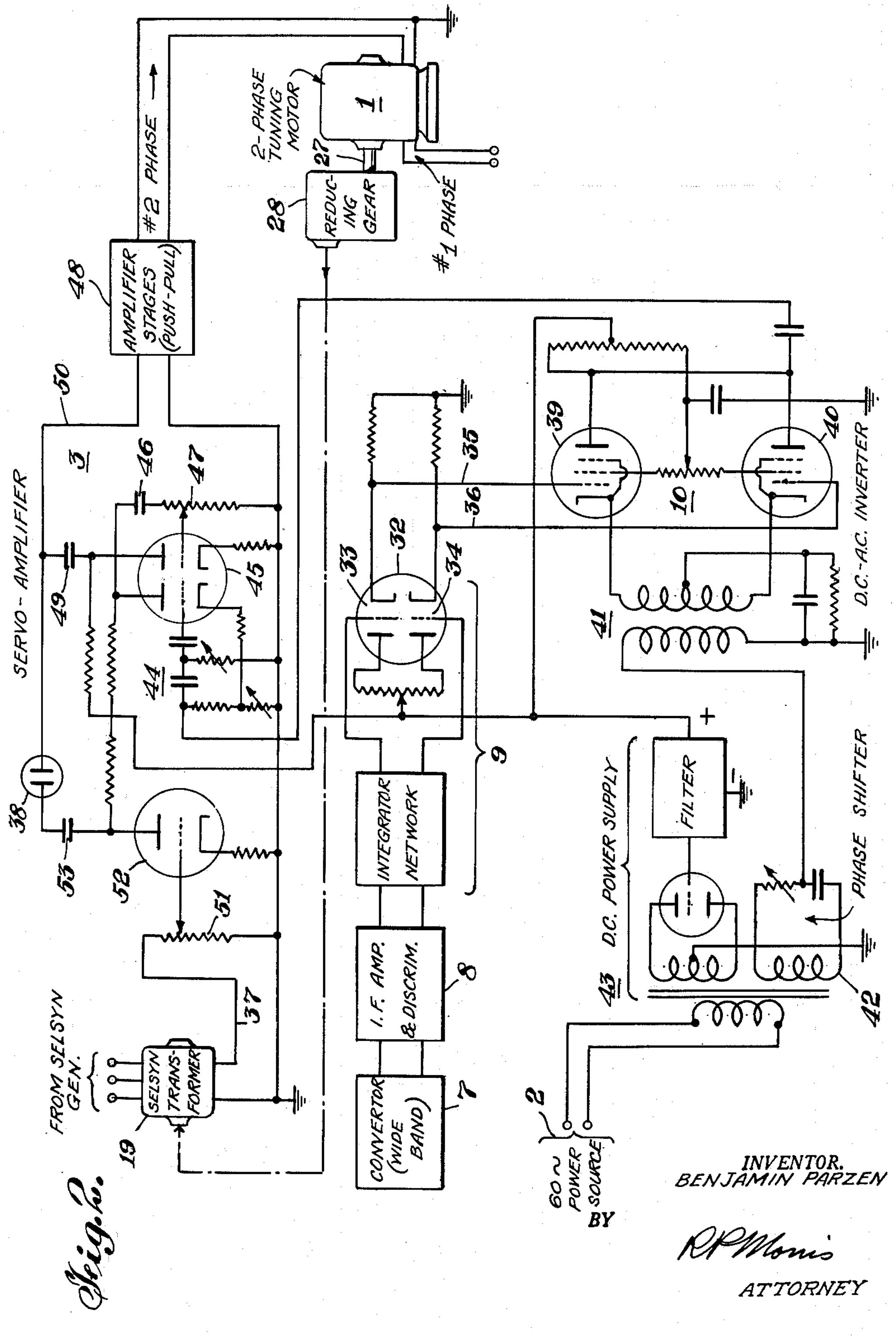

Other objects and advantages of my invention will be brought out in the more detailed description to follow. This description makes reference to the accompanying drawings in which:

Fig. 1 is a block diagram of a frequency control circuit which typifies the invention; and Fig. 2 is a schematic circuit diagram in which certain details of the invention are shown in more detail.

When my invention is to be used in connection with radar equipment, the tuning means of the receiver preferably comprises a two-phase motor 1, one phase of which is directly powered by a 60-cycle source 2, and the other phase, having a quadrature relation thereto, is applied in varying amplitude and with a leading or lagging phase, as determined by the requirements for correction of the tuning frequency. These requirements are determined by means of a so-called servo-amplifier unit 3 which is simultaneously controlled by two control energy sources.

The primary elements of the first of these control energy sources are a heterodyne oscillator 4 in the receiver 22 and a component of the incoming signal energy as collected on an antenna 5 and amplified in the R. F. amplifier 6. These components are mixed in a converter unit 7 and fed to a discriminator unit 8. Since the converter unit delivers a pulsed output the discriminator unit is designed to pass a wide band of frequencies. Its output is then fed to an integrator stage 9 from which a direct current is derived, the magnitude and polarity of which varies as a function of the deviation and advance or retard phase rotation of the receiver's oscillator frequency with respect to the incoming carrier.

The direct current, derived as stated, is fed to a variable inverter unit 10 by which an alternating current of 60-cycle frequency is generated.

The magnitude of this alternating current is varied as a function of the D. C. current and its phase corresponds to the polarity thereof.

The servo-amplifier unit 3 is controlled by the first of two control energy sources as described above, and by a second source which is fed thereto through a selsyn generator and transformer system. This system, as will presently be explained in more detail, may be mechanically coupled to a wobble-frequency tuner on the radar transmitter, if desired. It will also be shown that the second source is utilized in the servo-amplifier only when the frequency deviation of the receiver exceeds the limits which can be corrected by the first source.

Certain components of a radar transmitter 11 are shown in Fig. 1 by way of example, and the schematic showing is detailed only to the extent that would seem necessary for an understanding of the invention.

The tuning means of the transmitter may include slugs of magnetic material 12 and 13, which are ganged together and which are useful in varying the inductance of the R. F. tuning coils 12a and 13a respectively, being injected into the cores of these coils to a variable extent. When the frequency of the carrier wave is to be wobbled, movement of the slugs 12 and 13 may be made continuous by means of a motor 14 which is geared to a barrel-cam 15, the latter having a channel spirally formed around its periphery. This channel controls the transverse movement of a follower member 16 which is attached to the slug 12 and, therefore, causes the interconnected slugs to be driven reciprocally for varying the transmitter tuning.

A selsyn generator 17 is geared to the shaft of the barrel-cam 15. A three-phase circuit 18 leads to a selsyn transformer unit 19 by way of a phase-transposing switch 20. The switch 20 is of a quick-throw type and is reversed at each reversal of the direction of motion of the follower member 16, being geared to the barrel drum shaft 15 through a gear train 21. Thus each full revolution of the rotor in the generator 17 is accompanied by a 180°-phase-shift of the potentials in the stator windings of the selsyn transformer 19.

The receiver 22 comprises conventional circuit components including a radio frequency amplifier 6 fed with radiant energy which is collected on an antenna 5 of any suitable type, connections being made through a transmission line 23. A heterodyne oscillator 4 may, if desired, be tuned by means of a tuning device 23a having stator and rotor plates for varying its capacitance. The rotor is controlled by a main shaft 24 which is driven in either direction through transmission gears 25 and 26.

The 2-phase motor 1 has its shaft 27 coupled to a reducing gear train 28. This gear train has a low-speed shaft 29 which carries a pinion gear 30 for meshing with two gears 25 and 31 for driving the tuning device and the selsyn transformer respectively. It will be understood that these gear-train elements are shown and described merely for illustrative purposes and any other suitable mechanical transmission system may be substituted.

The output from the R. F. amplifier 6 is shown as being parallel-connected to two mixer stages, one, designated as 31a, being designed for a selective, or narrow band characteristic, as preferred in the conventional portion of the receiver, the other being a relatively wide band converter 7 which is auxiliary to the usual circuit components of the receiver and has for its purpose to develop an output which may be effective over a wider range of frequencies for carrying out the tuning control function. So, if the receiver becomes de-tuned by a substantial amount either above or below the frequency of the incoming carrier wave, the output from the converter 7 will still be of sufficient amplitude to control the intermediate frequency amplifier and discriminator unit 8.

The output from the discriminator may be directly utilized in the D. C.-A. C. inverter stage 10, but preferably it is first integrated and amplified in a cathode follower stage 32 which, in this case, is represented by a twin triode tube having triode sections 33 and 34.

When the receiver is exactly tuned to the incoming carrier wave, no voltage is produced in the discriminator 8. When the receiver is tuned to a frequency higher than that of the incoming carrier wave, the grid of the triode section 34 would be more negative than the grid of triode section 33. In this case the triode section 33 will be conductive and its cathode circuit 35 will deliver a control voltage to the servo-amplifier unit 3 with the result that this amplifier is caused to deliver driving power to the motor 1 in proper phase relation to the power directly applied from the commercial power main 2 so as to drive this motor in the proper direction for adjusting the tuning of the receiver to a lower frequency.

If the receiver is tuned to a frequency lower than that of the incoming carrier wave, the opposite effect will take place, namely: the triode section 34 in the cathode follower stage will be rendered conductive and current in circuit 36 will control the servo-amplifier unit 3 so as to apply power to the motor 1 and drive it in the proper direction for raising the tuning frequency of the receiver.

The input circuits of the cathode follower stage 32 are so designed as to produce integration of short pulses which represent the output from the discriminator 8. Thus a more steady voltage is delivered to the servo-amplifier unit 3 than would be the case if the output from the discriminator were to be applied directly to the inverter unit 10.

Whenever the de-tuning of the receiver is not so great as to disable the discriminator unit 8, there will be an integration of its pulse output which is supplied to the inverter unit 10. An A. C. current output from the latter will alone control the servo-amplifier unit 3 and cause the 2-phase motor 1 to perform its function of re-adjusting the tuning position of the shaft 24 in the receiver. At the same time the rotor in the selsyn tranformer unit 19 is driven through the gear transmission 28, 31 to a position of orientation such that no voltage will be generated in its output circuit 37 leading to input terminals of the servo-amplifier unit 3.

In the servo-amplifier unit 3 is an electronic switch including a gaseous discharge tube 38. This switch, as will later be explained in more detail, serves to connect and disconnect the circuits from the servo-transformer 19 and from the inverter 10 respectively, whenever the output from the mixer stage 7 loses control of its re-tuning function. This subject matter, as well as other details will be more clearly explained by reference to Fig. 2.

The inverter unit 10 comprises two electron discharge tubes 39 and 40 having their cathode circuits connected in the well known push-pull arrangement. It will be understood that these tubes, like other vacuum tubes of the system, may be replaced by tubes of other types if desired. A voltage which, for convenience is considered to have a frequency of 60 cycles per second, but which may have any other frequency for which the circuits are suitably designed, is introduced into the cathode circuits of the tubes 39 and 40 by means of an input transformer 41. The primary of this transformer is energized from a secondary winding 42 on the transformer 43 of the main supply unit.

The control grids in the tubes 39 and 40 are individually connected to conductors 35 and 36 from the cathode follower unit 32.

If the tubes 39 and 40 amplify equally, then no 60-cycle voltage will appear in their output circuits because the conductive state in one tube will be counterbalanced by a non-conductive state in the other tube and the voltage on the common portion of the two anode circuits will remain constant. If, however, the discriminator output is one-sided, it will cause the tubes 39 and 40 to be unequally conductive. In this case, the 60-cycle voltage delivered as output from the inverter unit 10 will be applied through a filter network 44 to the control grid of one section in a twin triode amplifier tube 45 in the servo-amplifier unit 3. The control grid in the second section of this tube is coupled to the anode in the first section through a coupling circuit comprising a capacitor 46 and a resistor 47. The output from the second section is phase, displaced with respect to the output from the inverter unit 10, being substantially in quadrature phase relation thereto. Further stages of amplification, including at least one push-pull stage are referenced 48 and are controlled by potentials fed through a capacitor 49 and an input circuit 50. The output from the amplifier 48 has a sine-wave shape of suitable phase and value to be applied to one of the 2-phase windings of motor 1, thereby to energize the same, and so to re-adjust the tuning of the receiver.

Whichever one of the tubes 39 or 40 in the inverter 10 becomes the more conductive will determine whether the phase relation of its output is leading or lagging with respect to that of the current supplied to the motor 1 by the source 2. It will be recalled that it is the polarity, as well as the amplitude of the D. C. input potential to the inverter unit 10, which controls the difference between the conductive states of the tubes 39 and 40. It will be clear, then, that the means shown and described are adequate for operating the tuning motor in either of two directions as needed for re-tuning the receiver.

The filter network 44, which was mentioned above, has for its purpose to pass certain side-band frequencies which have an aiding effect upon the operation of the servo-amplifier. This is explained by the fact that there is occasionally a tendency for the motor 1 to overdrive and to cause a setting of the receiver tuning beyond the point where it should be set. This action may repeat itself with increasing magnitude so that violent oscillation of the mechanical system occurs. However, such oscillation results in variations of amplitude of voltage from the inverter 10 and the consequent addition to that voltage of certain components which include the aforementioned side-band frequencies. I therefore take advantage of the presence of these side-band frequencies to prevent oscillation of the mechanical system and for this purpose the filter network 44 is so designed as to be effective in suppressing the mechanical oscillation of the tuning mechanism.

If the transmitter frequency were to be fixed instead of wobbled there would be little need for providing the auxiliary tuning control system which includes the electro-mechanical linkage between the tuning devices of the transmitter and the receiver. But this linkage has proven to be desirable in certain cases because of the wide band of frequencies through which the transmitter carrier is varied by the wobbling motor 14. Some of the details of the selsyn linkage and related components have already been described. Further details will now be directed to the method of applying corrective voltages from the selsyn transformer 19 to the servo-amplifier unit 3 when the tuning control potentials from the discriminator fail to perform their re-tuning function. It should be noted, however, as of particular importance to a system which includes a tuning control by electro-mechanical coupling of the transmitter and receiver tuners that the automatic frequency control through the receiver is arranged to resume the exercise of its junction as soon as the transmitter frequency has been shifted to within its workable band.

Any out-of-phase relation between the rotating field of the stationary coils in the selsyn transformer 19 produces an alternating voltage in its rotor which is connected to the output circuit 37. This alternating voltage is, or is not, used to control the servo-amplifier 3 depending upon the magnitude of the mis-tuning of the receiver. Under conditions of approximate tuning the orientation of the rotor in the selsyn transformer is such that its output energy is of very low value. Whatever it may be it is applied through a rheostat 51 to the control grid of an amplifier tube 52 whose anode is coupled to one electrode of the gas-filled tube 38 through a capacitor 53. The other electrode of tube 38 is connected to the junction between capacitor 49 and conductor 50.

The gas tube 38 acts as an open switch when not ignited. Therefore the output from the selsyn unit 19, even though amplified in the tube 52 has no conflicting influence upon the self-aligning operation of the discriminator and converter system. As soon as the tube 38 is ignited by a differential voltage across its electrodes, due to the generation of sufficient voltage in the selsyn unit 19, and the amplification of this voltage by the tube 52, an alternating current circuit is substantially closed between the anode of tube 52 and conductor 50. The voltage in this circuit dominates over that which may be derived from the servo-amplifier tube 3. As re-adjustment of the tuner in the receiver now takes place the voltage from the selsyn unit 19 is diminished and that from the inverter 10 is increased at first, but eventually diminished until exact re-alignment of the tuner is established. Then the two-phase motor 1 is no longer supplied with driving power and comes to rest. The gas tube 38 is extinguished and the system is restored to a stand-by condition, unless it is necessary for the receiver to be continuously adjusted to the wobble frequency of the transmitter.

In order manually to control the tuner at the receiver 22 I have provided a double-pole triple-throw switch 54 so that the indirectly derived phase component of power which is supplied to the 2-phase motor 1 may be momentarily obtained through a phase shifting unit 55, rather than through the servo-amplifier. The phase shifter 55 may be arranged to rotate the phase of its output by 90° with respect to the current from the source 2. The motor 1 may be driven in either direction at will by throwing the switch 54 to one or the other of two positions which are used for manual tuning. The leads are mutually reversed in these two positions and so change a leading phase to a lagging phase.

While I have described above the principles of my invention in connection with specific apparatus, it is to be clearly understood that this description is made only by way of example and not as a limitation to the scope of my invention.

I claim:

1. In a tuning control mechanism for a radio receiver with which an adjacent radio transmitter is associated for purposes of radar operation, a reversible two-phase motor for driving a tuning element in said receiver, a tuning device in said transmitter, a selsyn generator and transformer arranged and adapted to convert polyphase currents into a single phase current the amplitude and phase of which are both varied as a function of the instantaneous departure of rotor members in said selsyn units from mutually correspondin positions of orientation, and means for so energizing said motor with two-phase currents as to cause it to restore said tuning element of the receiver to a proper tuning position for reception of reflected signal energy radiated by said transmitter with maximum signal output, the last said means including circuit connections from said selsyn transformer to one of the windings in said two-phase motor, and circuit connections to a second of said motor windings for supplying low frequency alternating current thereto directly from a source with respect to which said selsyn transformer operates to produce phase displacement.

2. Tuning control mechanism for a radio receiver comprising means for mixing an incoming signal wave with a locally generated wave to obtain a difference frequency wave, an adjustable tuning member for varying the frequency of said locally generated wave, a discriminator operable in response to variations of said difference frequency for deriving either of two corrective pulse energy trains depending upon the direction of adjustment of said tuning member necessary to maintain proper tuning of said receiver for maximum signal output, means for translating one of said pulse energy trains having the greater amplitude into a direct current, alternatively present pulse trains being productive of direct currents of opposite polarity, a current inverter operable to derive an alternating current from either of said direct currents, a servo-amplifier arranged and adapted to deliver a low frequency sine wave having a quadrature phase relation to a given low frequency source and having an amplitude proportional to said direct current, a leading or lagging quadrature phase relation being determined by the polarity of the prevailing direct current, a two phase motor geared to said tuning member, connections to said motor from said low frequency source for supplying a first phase of its driving power and connections from said servo-amplifier for supplying a second phase of its driving power.

3. Tuning control mechanism according to claim 2 and in combination with auxiliary control means for feeding a substitute second phase of the driving power to said motor, this auxiliary control means being operable under control of a wobble-frequency tuning mechanism of an associated signal transmitter.

4. The method of adjusting the tuning of a radio receiver in accordance with variations of frequency of an associated transmitter, a reversible two-phase motor being mechanically coupled to tuning means of said receiver, and the tuning means of said transmitter being mechanically coupled to a selsyn generator which serves to control the amplitude and phase of an output current from an associated selsyn transformer, said method comprising the steps of constantly feeding to said motor one phase of a low frequency energy source, this frequency being the same as is applied to said selsyn units for energizing the same, amplifying said output current from the selsyn transformer, feeding the same to said motor as the second phase of its driving power, and reducing said output current substantially to a zero value in response to the tuning readjustment of said receiver by said motor.

5. A tuning control mechanism for a radio receiver with which an adjacent radio transmitter is electrically connected for purposes of radar operation, said transmitter being provided with means for wobbling the frequency of its radiant energy, said mechanism comprising a two-phase motor for driving a tuning element in said receiver, and alternatively operable devices for applying phase displaced potentials to said motor, thereby to cause said tuning element of the receiver to track with the frequency of said radiant energy as reflected and received, one of said devices comprising automatic frequency control means operable in response to deviations of an intermediate frequency derivative which result from maladjustment of said tuning element within a predetermined range, and the other of said devices comprising means operable by said frequency wobbling means for generating and transforming one of the phase-displaced potentials to be applied to said motor whenever the deviations of said intermediate frequency derivative extend beyond said predetermined range.

BENJAMIN PARZEN.

REFERENCES CITED

The following references are of record in the file of this patent:

UNITED STATES PATENTS

| Number | Name | Date |
|---|---|---|
| 2,380,947 | Crosby | Aug. 7, 1945 |
| 2,380,948 | Crosby | Aug. 7, 1945 |
| 2,433,804 | Wolff | Dec. 30, 1947 |
| 2,434,293 | Stearns | Jan. 13, 1948 |
| 2,434,294 | Ginzton | Jan. 13, 1948 |
| 2,445,409 | Shank | July 20, 1948 |